United States Patent
Lin

(10) Patent No.: US 7,046,081 B2
(45) Date of Patent: *May 16, 2006

(54) AMPLIFIER CIRCUIT WITH PASSIVE GAIN STEP CIRCUIT

(75) Inventor: Chih-I Lin, Unterhaching (DE)

(73) Assignee: Infineon Technologies AG, Munich (DE)

( * ) Notice: Subject to any disclaimer, the term of this patent is extended or adjusted under 35 U.S.C. 154(b) by 63 days.

This patent is subject to a terminal disclaimer.

(21) Appl. No.: 10/783,703

(22) Filed: Feb. 20, 2004

(65) Prior Publication Data

US 2004/0227569 A1    Nov. 18, 2004

(30) Foreign Application Priority Data

Feb. 20, 2003   (DE) ................ 103 07 315

(51) Int. Cl.
 *H03F 1/14*    (2006.01)
(52) U.S. Cl. ........................... 330/50; 330/296
(58) Field of Classification Search ......... 330/51, 330/296, 285, 289, 297, 133, 267, 261, 50
See application file for complete search history.

(56) References Cited

U.S. PATENT DOCUMENTS

| | | | | |
|---|---|---|---|---|
| 5,880,631 | A * | 3/1999 | Sahota | 330/51 |
| 6,144,254 | A * | 11/2000 | Irvine et al. | 330/51 |
| 6,522,195 | B1 * | 2/2003 | Watanabe et al. | 330/51 |
| 6,624,702 | B1 * | 9/2003 | Dening | 330/297 |
| 6,731,171 | B1 * | 5/2004 | Yamashita | 330/285 |
| 6,768,377 | B1 * | 7/2004 | Macedo | 330/51 |
| 6,803,822 | B1 * | 10/2004 | Kim et al. | 330/296 |

FOREIGN PATENT DOCUMENTS

EP    1 107 451 A2    11/2000

* cited by examiner

*Primary Examiner*—Don Le
*Assistant Examiner*—Lam T. Mai
(74) *Attorney, Agent, or Firm*—Maginot, Moore & Beck

(57) ABSTRACT

An amplifier circuit includes an amplifier connected between an HF input and HF output and a coupling circuit connected in parallel to the amplifier between the HF input and the HF output. The coupling circuit includes an input bipolar transistor whose collector terminal or emitter terminal is high-frequency coupled to the HF input, and a coupling diode structure which is high-frequency coupled between the base terminal of the input bipolar transistor and the HF output.

20 Claims, 4 Drawing Sheets

PRIOR ART

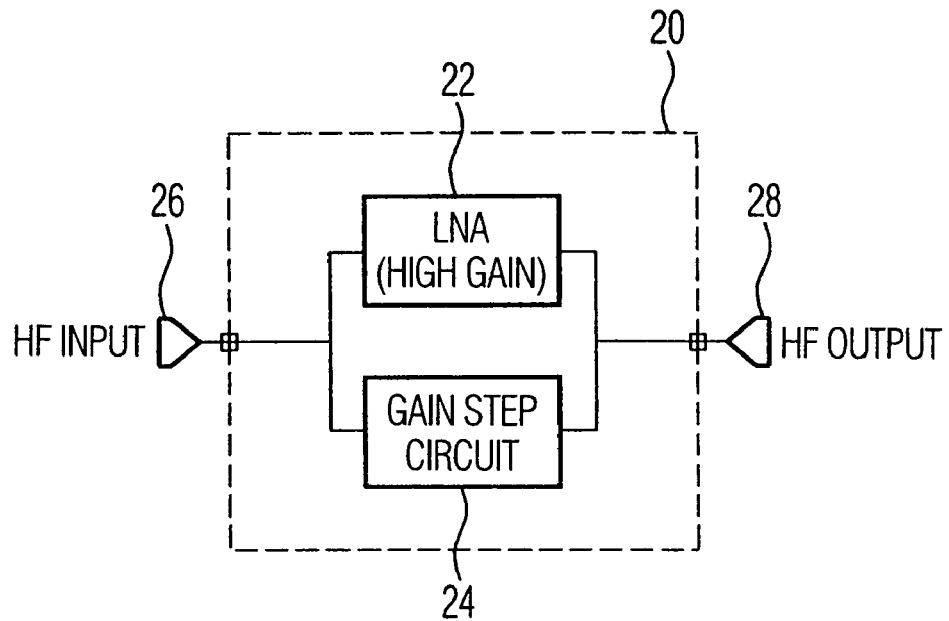
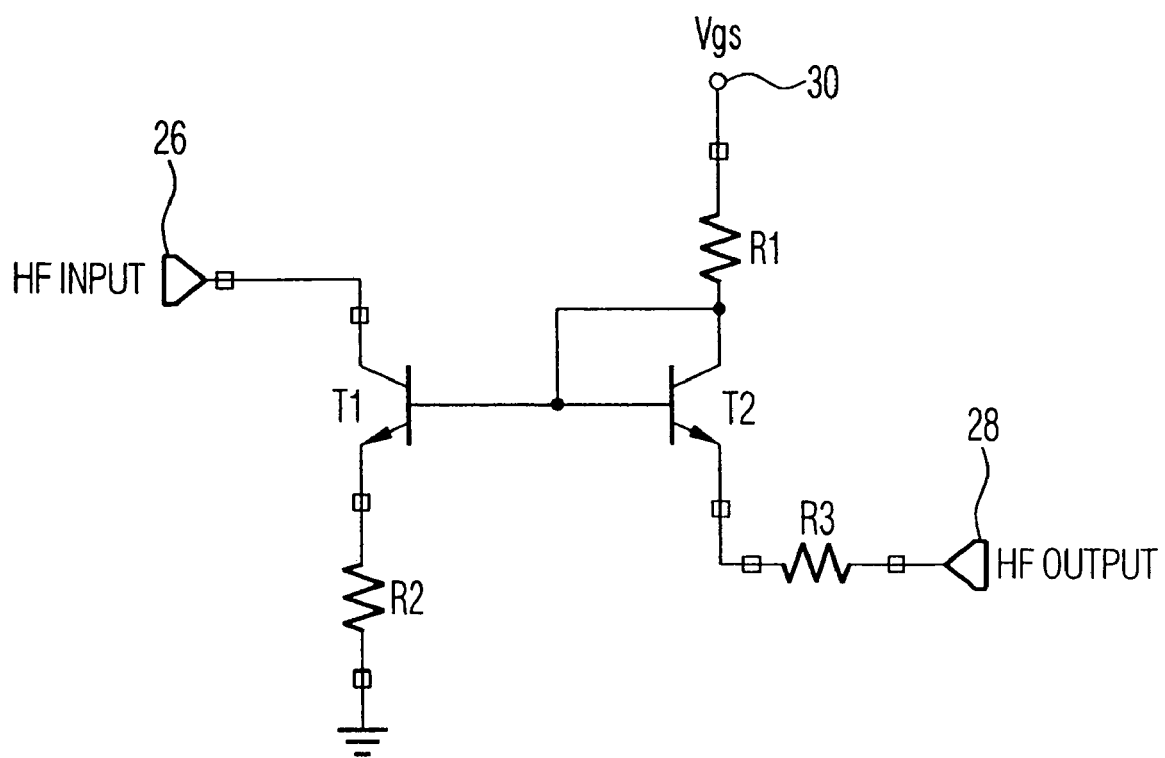

AMPLIFIER CIRCUIT WITH PASSIVE GAIN STEP CIRCUIT

BACKGROUND OF THE INVENTION

1. Field of the Invention

The present invention relates to an amplifier circuit and in particular to an amplifier circuit which may be used as a low noise amplifier (LNA) and comprises a gain step circuit.

2. Description of the Related Art

In mobile telecommunications, LNAs are used in the receiver, i.e. for example in a mobile telephone. Depending on the distance between the receiver and the transmitter, the level of the signal arriving at the receiver varies in a wide range. In order to prevent the amplifier to be overridden with a higher input signal level, it is known to use a so-called gain step circuit which may also be referred to as a secondary gain stage and which is switched in parallel to the LNA. The receiver switches the LNA on and the gain step circuit off when a weak signal arrives. This way of operation is typically referred to as a high gain mode. Conversely, the receiver switches the LNA off and the gain step circuit (GS circuit) on when a strong signal is received. This mode of operation is known as the gain step mode. Shifting over between the different modes is realized by the receiver based on a control signal which depends on the sampled level of the input signal.

An exemplary LNA according to the prior art is shown in FIG. 1. The LNA includes a bipolar transistor VT1, whose base terminal is high-frequency coupled to a high-frequency input HFin, where an HF input signal to be amplified is received. The collector terminal of the bipolar transistor VT1, via a resistor VR1 and an inductivity VL1, is connected to a supply voltage terminal to which a supply voltage Vcc may be applied. Further, the collector of the bipolar transistor VT1 is connected to its base terminal via a resistor VR2. The collector of the bipolar transistor VT1 is further high-frequency coupled, via a capacitor VC1, to a high frequency output HFout where the amplified input signal is output. The emitter of the bipolar transistor VT1 is at a reference potential, typically ground. The components of the LNA typically formed on an LNA chip are illustrated in FIG. 1 by the dashed frame 10.

Further, in FIG. 1 an external so-called external LC swamp is shown which is provided in order to improve the IIP3 (input intercept point 3) in order to thereby reduce distortions. The LC swamp includes an external inductivity $L_{ext}$ and an external capacity $C_{ext}$.

In the LNA shown in FIG. 1, via the coil VL1, serving as an HF choke, and the resistor VR1, the supply voltage is applied to the transistor VT1, wherein the coil VL1 and the resistor VR1 operate as a load for the transistor. The capacitor VC1 serves for a DC decoupling and the resistor VR2 serves for applying a suitable bias to the basis of the bipolar transistor VT1 in order to set the operating point of this transistor.

As it was set out above, in order to prevent the LNA to be overridden, a switchover to a gain step circuit is performed when a strong signal is received at the HF input. Such a gain step circuit should consume as little current as possible and if possible provide a matching as good as the LNA with regard to the input matching and the output matching to the external components. These two problems could not be solved simultaneously up to this day.

In the past, different concepts were realized as gain step circuits. One such concept was to connect a gain step circuit in parallel to the LNA and to provide a decoupling capacitor at the HF input in order to decouple DC signals.

In one integrated solution, however, the substrate resistor of the non-ideal decoupling capacitor represents a load with respect to the performance of the LNA. An alternative concept is to use no separate gain step circuit, but to switch over the LNA in the gain step mode to a level with a negative amplification. This is disadvantageous in so far that when switching over the input/output impedance changes substantially and the LNA in the gain step mode is no longer matched. A third alternative concept was to use a gain step circuit in parallel to the LNA which is set up identically to the LNA, comprises, however, a substantially lower amplification. The power consumption of the gain step circuit in a range from 5 to 10 mA is equal to the power consumption of the LNA, i.e. the high gain stage, so that in switching over between the stages the input/output impedance remains the same for a good matching. Such a high power consumption in the gain step mode is not desirable, however.

SUMMARY OF THE INVENTION

It is the object of the present invention to provide an amplifier circuit enabling a switchover between a high gain mode and a low gain mode and providing a low power consumption and a good matching in the low gain mode.

The present invention provides an amplifier circuit, comprising:

an amplifier connected between an HF input and an HF output; and a coupling means connected in parallel to the amplifier between the HF input and the HF output, wherein the coupling means comprises:

an input bipolar transistor whose collector terminal or emitter terminal is high-frequency coupled to the HF input; and an output diode structure which is high-frequency coupled between the base terminal of the input bipolar transistor and the HF output.

According to the invention, when the coupling means is active, in order to couple an input signal from the HF input to the HF output, the collector base diode or the emitter base diode of the input transistor, whichever is connected into the coupling path, and the output diode structure will be operated in saturation in flow direction, and when the coupling means is not active, in order to couple an input signal from the HF input to the HF output, the collector base diode or the emitter base diode, whichever is connected into the coupling path, and the diode structure will represent depletion layer capacities.

In preferred embodiments of the present invention, the output diode structure is formed by the basis emitter diode or the basis collector diode of a further bipolar transistor which is connected as a diode, by short-circuiting the collector terminal and the base terminal of the same (or alternatively the emitter terminal and the base terminal).

The inventive coupling means presents a passive gain step circuit which does not provide an amplification to which a switch-over may be performed when a strong HF input signal is applied to the HF input, to thereby prevent that the amplifier is overridden which will generally be an LNA.

According to the invention, the coupling means, presenting a gain step circuit, is connected in parallel to the amplifier such that the two circuits, when the gain step circuit is not used in the high gain mode, automatically decouple by the collector base diode (or the emitter base diode) of the input bipolar transistor connected to the HF input and the output diode structure connected to the HF output (which will generally be the base emitter diode or the base collector diode of a further bipolar transistor, may, however, also be realized by an actual diode). For activating the coupling means, a suitable control voltage is applied to the bipolar transistor and the diode structure, in order to bias the same in saturation in forward direction in order to couple in or couple out, respectively, power in or out of the coupling means.

In preferred embodiments of the present invention, the amplifier circuit is implemented such that by applying this control voltage the amplifier is automatically switched off. For this purpose, by the control voltage a switch may be operated which switches off the amplifier. This switch may for example pull the base potential of the bipolar transistor of the amplifier to such a low value that the amplifier is switched off. This switch may be realized by the bipolar transistor or the coupling means connected to the HF input.

The amplifier circuit comprising the gain step circuit according to the present invention offers numerous advantages when compared to prior solutions. On the one hand, the inventive gain step circuit consumes substantially less operating current that then amplifier, i.e. the LNA. Further, input impedance and output impedance of the gain step circuit may easily be adjusted by modifying the transistor sizes and the resistors, so that theses impedances comprise similar values as in the high gain mode in which the amplifier is active and the coupling means is inactive. This characteristic enables a good matching at the HF input and at the HF output in the gain step mode. Further, the forward transmission factor in the gain step mode may easily be set by a corresponding setting of resistors used in the gain step circuit and by setting the control circuit of the gain step stage. In addition, by a low depletion layer capacity of the collector base diode or the emitter base diode of the bipolar transistor and the diode structure switched into the coupling space in reverse direction external to the gain step mode enables a good insulation of the gain step circuit to the LNA. Thereby, a separation of the design for the LNA and the gain step circuit is possible, which results in shortened development times.

BRIEF DESCRIPTION OF THE DRAWINGS

In the following, preferred embodiments of the present invention are explained in more detail with reference to the accompanying drawings, in which:

FIG. 2 shows a coarse block diagram of an inventive amplifier circuit;

FIG. 3 shows a circuit diagram of an embodiment of a gain step circuit used according to the invention;

DESCRIPTION OF THE PREFERRED EMBODIMENTS

Figure 1:
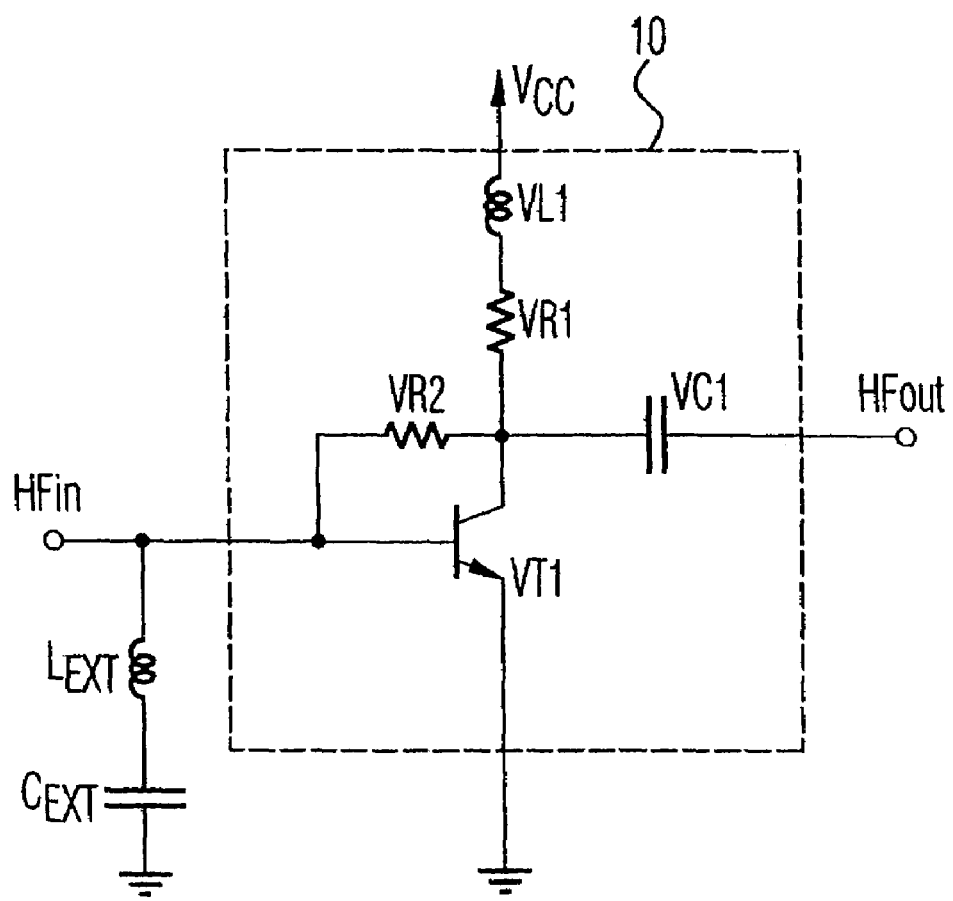
FIG. 1 shows a realization of an LNA according to the prior art.

With reference to the accompanying drawings, the present invention is described in the following with reference to embodiments in which the amplifier represents a local noise amplifier and the coupling means represents a gain step circuit. As it was mentioned above, such amplifier circuits are in particular used in the fields of mobile telecommunications, for example in mobile telephones, in which the HF input signal is subject to strong level fluctuations, so that depending on the level of the input signal a switchover is performed between the LNA and the gain step circuit.

In FIG. 2, an amplifier circuit chip 20 is shown, comprising an LNA 22 representing a high gain stage and a gain step circuit 24 which is a passive coupling means according to the invention. The amplifier circuit chip 22 has an HF input 26 and an HF output 28.

With reference to FIG. 3, in the following the setup of an inventive embodiment of the gain step circuit 24 is explained, while in the following with reference to FIG. 4 an embodiment of an inventive amplifier circuit is described.

The embodiment of the gain step circuit shown in FIG. 3 includes a first bipolar transistor T1, a second bipolar transistor T2 and three resistors, R1, R2 and R3.

The collector terminal of the bipolar transistor T1 is connected to the HF input 26. The emitter terminal of the bipolar transistor T1 is connected to a reference potential, ground in the illustrated embodiment, via the resistor R2. The base terminal of the bipolar transistor T1 is connected to the base terminal of the bipolar transistor T2 and, via the resistor R1, to a bias terminal for applying a bias or control voltage Vgs.

The bipolar transistor T2 is connected as a diode, by short circuiting its collector terminal to its base terminal. Thus, base terminal and collector terminal of the bipolar transistor T2 are further connected to the bias terminal 30 via the resistor R1. The emitter of the bipolar transistor T2 is connected to the HF output 28 via the resistor R3.

Figure 4:
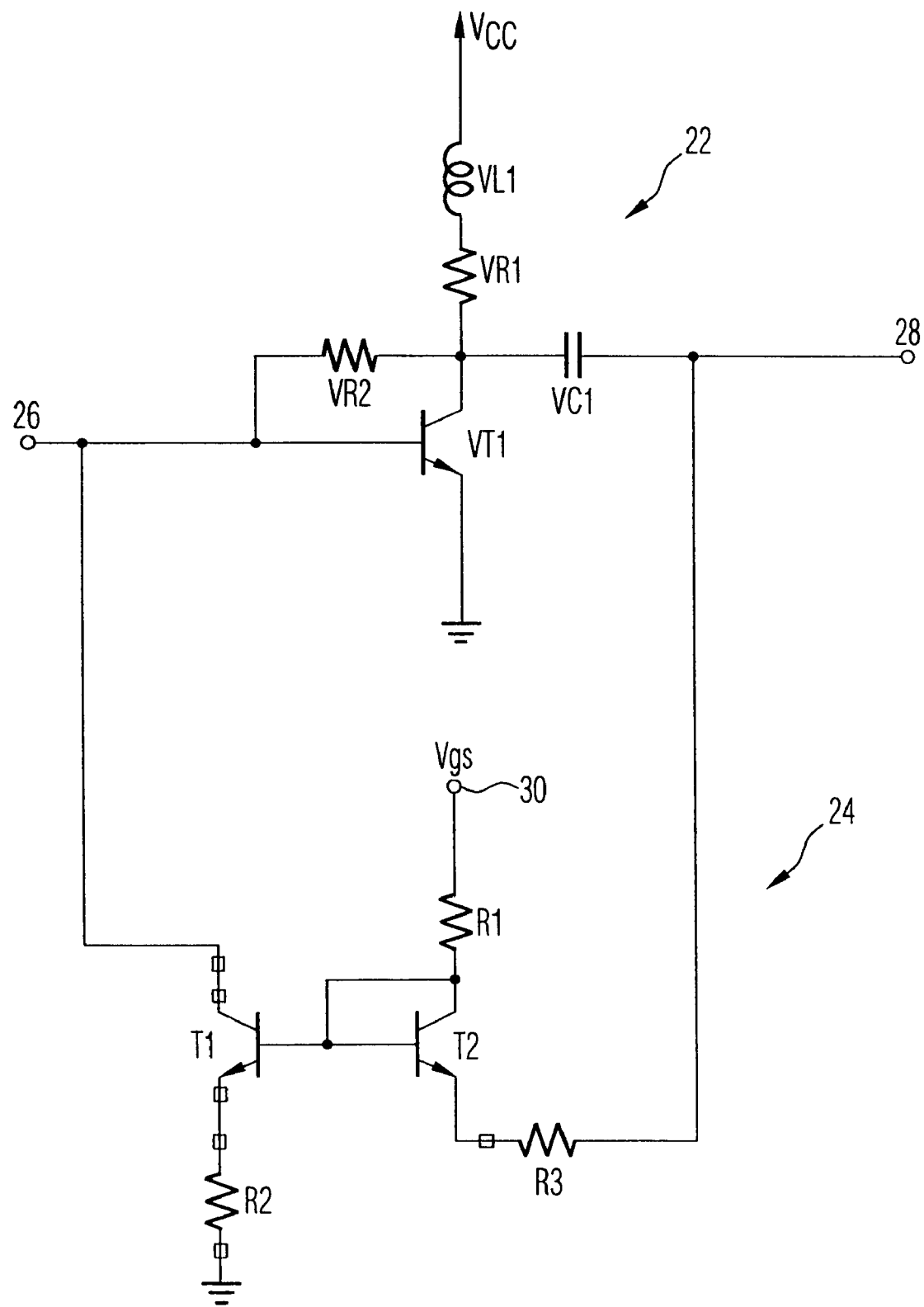
FIG. 4 shows an embodiment of an inventive amplifier circuit.

In FIG. 4, the parallel circuit of the gain step circuit shown in FIG. 3 and of an LNA is shown, wherein the LNA shown in FIG. 4 for example comprises the setup of the LNA above described with reference to FIG. 1.

With reference to FIG. 4, in the following the functioning of the inventive amplifier circuit and in particular the functioning of the gain step circuit is discussed.

In the high gain mode, the LNA 22 is switched on and the gain step circuit 24 is switched off. In the high gain mode, the bipolar transistor VT1 amplifies an HF signal received at the HF input 26 to the HF output 28, to which the supply voltage Vcc is applied. In this high gain mode, at the bias terminal 30 such a control voltage Vgs is applied, that the bipolar transistors T1 and T2 of the gain step circuit 24 are switched off. Generally, the control voltage Vgs for this purpose is 0 V. In this state, the low depletion layer capacity of the collector base diode of the transistor T1 causes a good separation of the gain step circuit from the HF input and therefore from the LNA. Accordingly, the low depletion layer capacity of the base emitter diode of the bipolar transistor T2 causes a good separation of the gain step circuit from the HF output 28 and therefore from the LNA. The low indicated depletion layer capacities cause a good decoupling of the gain step circuit which is switched off from the LNA which is switched on, so that the performance of the LNA with regard to amplification, noise figure and the same is hardly affected by the gain step circuit.

In response to an external control signal, a switch-over from the high gain mode to the gain step mode is performed, in which the gain step circuit 24 is switched on and the LNA is switched off. The control signal may be referred to as an external control signal, as it is generally generated outside the amplifier circuit 20, as it is shown in FIG. 2. This control signal may be generated in a conventional way, by sampling the level of the input signal applied to the HF input, in order to generate a suitable control signal which causes a switch-over into the gain step mode for an input signal level which lies above a predetermined threshold value.

If the control signal indicates that a switch-over is to be performed into the gain step mode, the control voltage Vgs applied to the bias terminal 30 is increased to a value which causes a potential at the base terminals of the bipolar transistors T1 and T2, which is sufficient, to bias the collector base diode of the bipolar transistor T1 and the base emitter diode of the bipolar transistor T2 in saturation in flow direction. As the HF output 28 is generally grounded as far as DC is concerned, for this a control voltage Vgs larger than about 1 Volt is sufficient depending on the potential present at the base of the bipolar transistor VT1 of the LNA.

By such an increase of the control voltage Vgs, as the gain step circuit and the LNA are connected at the HF input, the base current of the transistor VT1 is drawing from the LNA and the LNA is switched off. The base voltage of the bipolar transistor VT1 thereby falls to a low value in the mV range. Therefore, the bipolar transistor T1 of the gain step circuit 24 which may be referred to as the input transistor operates in saturation. Depending on the applied control voltage and the size of the resistors the gain step circuit, the CB diode of the coupling transistor T1 is for example biased in flow direction with a voltage of approx. 0.8 Volt. In the same way, the bipolar transistor T2 which may be referred to as the output transistor operates in saturation, i.e. the base emitter diode of the same is biased in flow direction with a voltage of approx. 0.8 Volt.

The voltage drop caused by the base current of the bipolar transistor T1 via the resistor R2 is sufficiently low, so that the potential at the base of the amplifier bipolar transistor VT1 is pulled to a value which is sufficient to switch off the LNA.

By the collector base diode of the coupling transistor T1 operated in flow direction, the HF power of the HF input 26 is coupled into the gain step circuit, while the same is coupled out to the HF output 28 by the base emitter diode of the output transistor T1 which is biased in flow direction and the resistor R2.

Via the resistor R2 on the one hand the base current is drawn from the amplifier bipolar transistor VT1. On the other hand, via the resistor R2 and the collector base diode and the base emitter diode of the transistor T1 a suitable input impedance of the gain step circuit may be set in the gain step mode which is similar or identical to the one of the LNA in the high gain mode, so that a good matching in both modes is achieved. Via the resistor R1, a suitable base potential of the transistors T1 and T2 is caused. Via a corresponding dimensioning of the transistor T2 and the resistor R3 a suitable output impedance may be set which is in the gain step mode again similar or identical to the output impedance of the LNA in the high gain mode.

The gain step circuit 24 represents a passive circuit, in so far, that it does not provide an amplification of the HF signal coupled through the same. Rather, the HF signal is attenuated by the gain step circuit, wherein the pass level as well as the input matching and the output matching may in practice be set by a suitable selection of the transistor sizes and the resistors. It is to be noted here, that in the circuit-switched state of the transistor T1 one part of the HF power flows via the resistor R2 and another part drops via the resistor R3.

Figure 5:
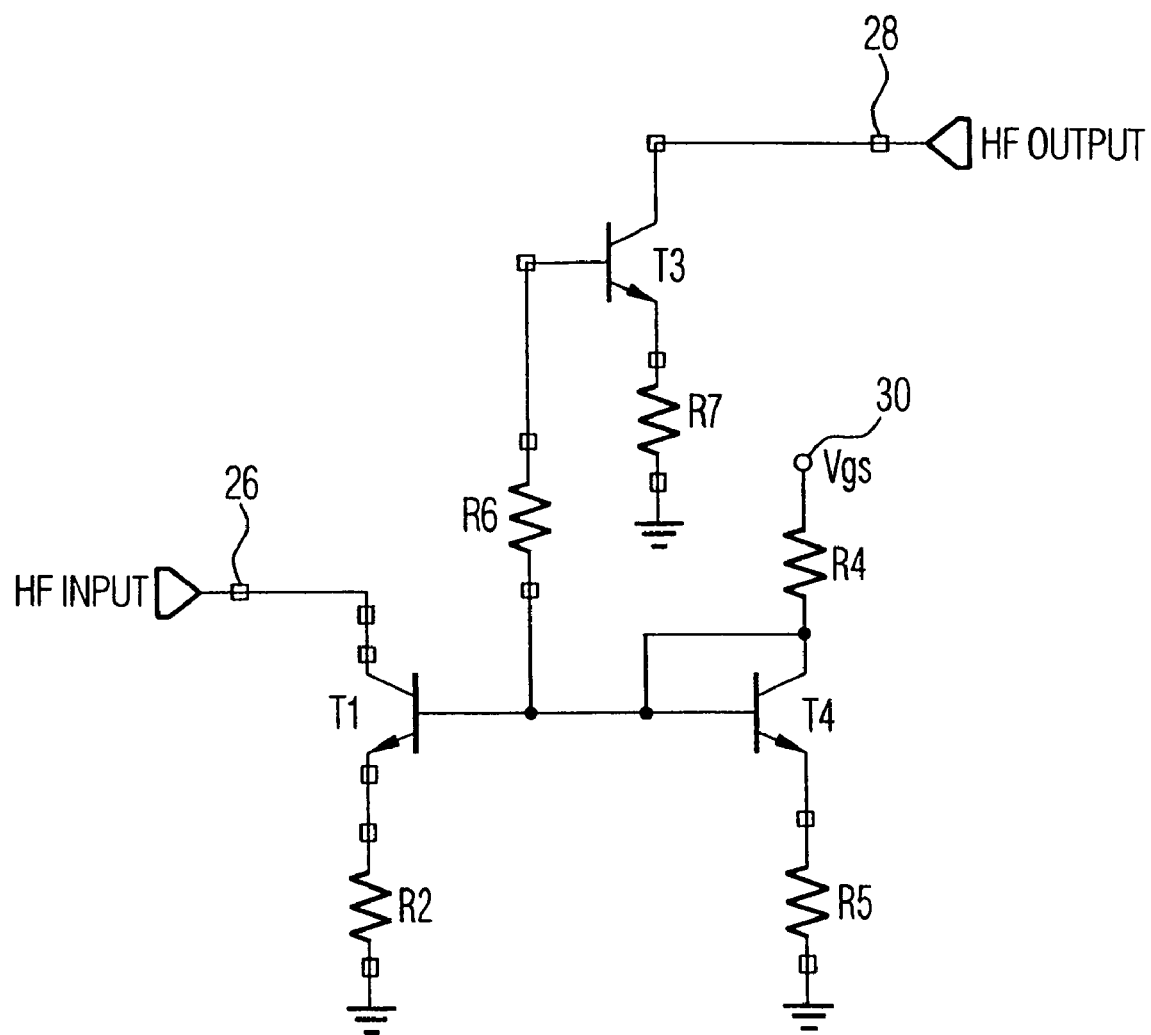
FIG. 5 shows a further embodiment of a gain step circuit.

An alternative embodiment to the embodiment shown in FIG. 4 of a gain step circuit is shown in FIG. 5. The gain step circuit shown in FIG. 5 is again connected between the HF input 26 and the HF output 28 in parallel to the LNA. The gain step circuit shown in FIG. 5 includes the first bipolar transistor T1, a second bipolar transistor T3, a third bipolar transistor T4 and resistors R2, R4, R5, R6 and R7.

The collector terminal of the first bipolar transistor T1 is again connected to the HF input 26, while the emitter terminal of the same is connected to ground via the resistor R2. The base terminal of the bipolar transistor T1 is connected to the base terminal of the bipolar transistor T4 and, via the resistor R6, to the base terminal of the transistor T3. The collector terminal of the transistor T3 is connected to the HF output 28, while the emitter terminal of the same is connected to ground via the resistor R7. The base terminal of the bipolar transistor T4 is short circuited with the collector terminal of the same and is further connected to the control voltage Vgs via the resistor R4. Finally, the emitter terminal of the bipolar transistor T4 is connected to ground via the resistor R5. The HF output 28 is grounded as far as DC is concerned, generally via an inductivity.

In the gain step circuit shown in FIG. 5, the transistor T4 which is connected as a diode only has the function to control the input transistor T1 or the output transistor T3, respectively, i.e. of controlling the bias voltage to be applied to the base terminals of these transistors, in order to switch the gain step circuit on or off, respectively. By a corresponding bias voltage in this example, the bipolar transistor T1 is operated in saturation for coupling in and the transistor T3 for coupling out. The coupling out of the HF power is performed via the base collector diode of the saturated bipolar transistor T3.

By a suitable dimensioning of the transistor T1 and the resistor R2 the input impedance may be set. The output impedance may be set by a suitable dimensioning of the transistor T3 and the resistor R7. The optional resistor R6 may be provided as an additional variable for setting the base potential of the transistor T3 or setting the pass level of the gain step circuit. The resistor R5 is dimensioned in order to prevent an excessive loss of HF power via the same.

It is the advantage of the gain step circuit shown in FIG. 5 that the depletion layer capacity of the collector base diode of a bipolar transistor is generally lower than the one of the base emitter diode. Thus, in the circuit shown in FIG. 5, in the high gain mode the feedback of the output back to the input via the switched off gain step circuit may be reduced even more.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An amplifier circuit, comprising:
    an amplifier connected between a high frequency (HF) input and an HF output; and
    a first circuit connected in parallel to the amplifier between the HF input and the HF output, wherein the first circuit further comprises:
    an input bipolar transistor having at least one of a collector terminal and a emitter terminal coupled to the HF input; and
    an output diode structure high-frequency coupled between the base terminal of the input bipolar transistor and the HF output.

2. The amplifier circuit according to claim 1, wherein the amplifier comprises an amplifier bipolar transistor having a base terminal coupled to the HF input, wherein the input bipolar transistor of the first circuit is operably connected to draw the base potential of the amplifier bipolar transistor to such a potential that the amplifier is switched off when the first circuit is switched on.

3. The amplifier circuit according to claim 1, wherein at least one of the emitter terminal and the collector terminal of the input bipolar transistor is connected to ground via a resistor.

4. The amplifier circuit according to claim 1, wherein the first circuit further comprises a bias input coupled to receive a bias voltage and further coupled to apply the bias voltage to the input bipolar transistor and the diode structure in order to thereby switch on the first circuit.

5. The amplifier circuit according to claim 4, wherein the collector terminal of the input bipolar transistor is high-frequency coupled to the HF input, wherein the bias voltage is implemented to operate the collector base diode of the input-bipolar transistor and the diode structure in saturation in flow direction when the first circuit is switched on and to operate the collector base diode of the input bipolar transistor and the diode structure in reverse direction when the first circuit is switched off.

6. The amplifier circuit according to claim 4, wherein the bias voltage depends on a level of the HF input signal.

7. The amplifier circuit according to claim 1, wherein the output diode structure comprises at least one of the base collector diode and the base emitter diode of a bipolar transistor.

8. The amplifier circuit according to claim 7, wherein the collector terminal of the bipolar transistor is connected to the base terminal of the bipolar transistor, wherein the base terminals of the input bipolar transistor and the bipolar transistor are connected via a resistor to the bias input, and wherein a resistor is connected between the HF output and the emitter terminal of the bipolar transistor.

9. The amplifier circuit according to claim 7, wherein the collector terminal of the bipolar transistor is connected to the HF output and wherein the emitter terminal of the bipolar transistor is connected to ground via a resistor.

10. The amplifier circuit according to claim 9, further comprising a circuit for applying a supply voltage, the circuit for applying the supply voltage including a bias circuit bipolar transistor having a collector terminal and a base terminal that are connected to each other and via a resistor to a bias terminal, wherein the emitter terminal of the bias circuit bipolar transistor is connected to ground via a resistor, and the base terminal of the bias circuit bipolar transistor is connected to the base terminal of the input bipolar transistor and connected to the base terminal of the bipolar transistor.

11. An amplifier circuit, comprising:
an amplifier connected between an input and an output; and
a first circuit connected in parallel to the amplifier between the input and the output, wherein the first circuit further comprises:
a first bipolar transistor having at least one of a collector terminal and an emitter terminal coupled to the input; and
a second bipolar transistor having a base coupled to a base of the first bipolar transistor, the second bipolar transistor having one of a collector terminal and an emitter terminal coupled directly to the base, and the other of the collector terminal and the emitter terminal coupled to the output.

12. The amplifier circuit of claim 11, wherein the amplifier comprises an amplifier bipolar transistor having a base terminal coupled to the input, wherein the input bipolar transistor of the first circuit is operably connected to draw the base potential of the amplifier bipolar transistor to such a potential that the amplifier is switched off when the first circuit is switched on.

13. The amplifier circuit according to claim 11, wherein at least one of the emitter terminal and the collector terminal of the input bipolar transistor is connected to ground via a resistor.

14. The amplifier circuit of claim 15, further comprising a resistor coupled between the emitter terminal of the second bipolar transistor and the output.

15. An amplifier circuit, comprising:
an amplifier connected between an input and an output; and
a first circuit connected in parallel to the amplifier between the input and the output, wherein the first circuit further comprises:
a first bipolar transistor having at least one of a collector terminal and an emitter terminal coupled to the input;
a second bipolar transistor having a base coupled to a base of the first bipolar transistor, the second bipolar transistor having one of a collector terminal and an emitter terminal coupled directly to the base of the second bipolar transistor; and
a diode structure coupled between the base of the first bipolar transistor and the output.

16. The amplifier circuit of claim 15, wherein the diode structure is a base emitter junction of the second bipolar transistor.

17. The amplifier circuit of claim 15, wherein the diode structure is a collector base junction of a third bipolar transistor.

18. The amplifier circuit of claim 17, wherein the third bipolar transistor includes a base connected to the base of the first transistor.

19. The amplifier circuit of claim 15, wherein the amplifier comprises an amplifier bipolar transistor having a base terminal coupled to the input, wherein the input bipolar transistor of the first circuit is operably connected to draw the base potential of the amplifier bipolar transistor to such a potential that the amplifier is switched off when the first circuit is switched on.

20. The amplifier circuit according to claim 15, wherein at least one of the emitter terminal and the collector terminal of the input bipolar transistor is connected to ground via a resistor.

* * * * *